United States Patent
Lau et al.

(10) Patent No.: US 6,667,073 B1
(45) Date of Patent: Dec. 23, 2003

(54) LEADFRAME FOR ENHANCED DOWNBOND REGISTRATION DURING AUTOMATIC WIRE BOND PROCESS

(75) Inventors: Yung Piu Lau, Tsing Yi (HK); Mohamed Lebbai Moosa Naina, Kowloon (HK)

(73) Assignee: Quality Platers Limited, New Territories (HK)

( * ) Notice: Subject to any disclaimer, the term of this patent is extended or adjusted under 35 U.S.C. 154(b) by 0 days.

(21) Appl. No.: 10/140,318

(22) Filed: May 7, 2002

(51) Int. Cl.[7] .................................................. B05D 5/12
(52) U.S. Cl. ...................... 427/96; 427/125; 427/126.5; 427/256; 427/337
(58) Field of Search .......................... 427/96, 123, 125, 427/126.5, 256, 337

(56) References Cited

U.S. PATENT DOCUMENTS

| | | | | |
|---|---|---|---|---|
| 3,793,038 A | * | 2/1974 | Maguire | 427/443.1 |
| 4,065,626 A | * | 12/1977 | Franz | 428/629 |
| 4,894,752 A | * | 1/1990 | Murata et al. | 361/813 |
| 6,339,200 B1 | * | 1/2002 | Shi et al. | 200/305 |
| 6,396,129 B1 | * | 5/2002 | Hung et al. | 257/666 |
| 6,525,406 B1 | * | 2/2003 | Chung et al. | 257/666 |

FOREIGN PATENT DOCUMENTS

JP   110879   *   4/2002

* cited by examiner

*Primary Examiner*—Brian K. Talbot
(74) *Attorney, Agent, or Firm*—Keating & Bennett, LLP

(57) ABSTRACT

A process for enhancing visual detectability of a leadframe having a die attach pad and a plurality of contacts, during automated wirebonding in the production of an integrated circuit package. At least one of a ring, a line and an array of dots are plated on the die attach pad of the leadframe and around a periphery of the die attach pad. The leadframe is surface treated to cause a color change on a surface of the leadframe for improved visual detectability of the at least one of the ring, the line and the dots.

9 Claims, 3 Drawing Sheets

Step 1: Raw Material (Cu Panel)

Step 2: Etch Resist Coating

Step 3: UV Exposure With Phototool

Step 4: Developing

Step 5: Immersion Etching and Stripping

Step 6: Selective Plating with Ag And
Chemical Dipping

Step 7: Die Attach, Wire Bonding, Molding
And Singulation or Saw Punching

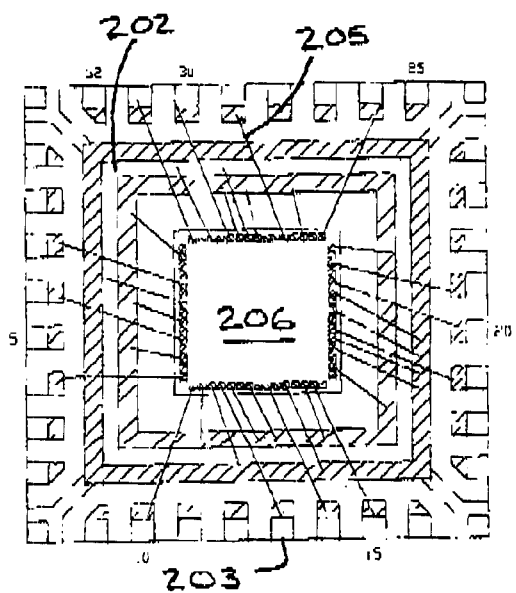
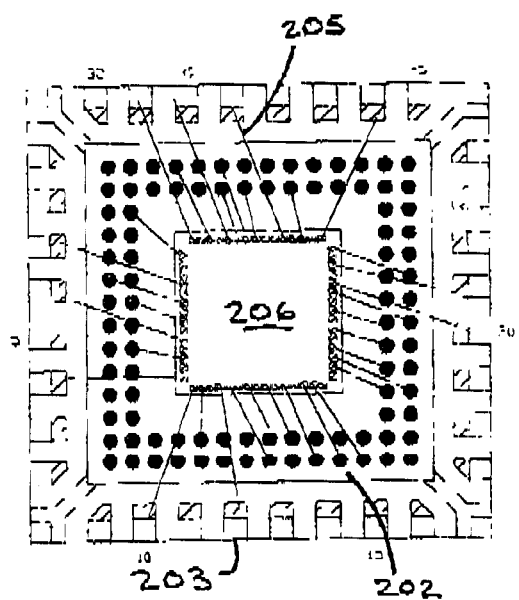
FIG. 2A
FIG. 2B

LEADFRAME FOR ENHANCED DOWNBOND REGISTRATION DURING AUTOMATIC WIRE BOND PROCESS

FIELD OF THE INVENTION

This invention relates in general to integrated circuit packaging, and more particularly to improved integrated circuit packages for enhanced automated visual detection of downbond sites during wire bonding.

BACKGROUND OF THE INVENTION

High performance integrated circuit (IC) packages are well known in the art. These high-performance IC packages include, for example, plastic chip carrier packages, leafless plastic chip carrier packages, quad flat pack IC packages, and others.

In order to provide uniform ground and power supplies to IC packages and to reduce electrical noise, it is desirable to have many ground bond interconnects. Commonly, IC packages include many ground wires to the die attach pad of the leadframe, which is traditionally flooded with silver for ease of manufacture.

Downbond wire length affects the tuning of the IC circuit, particularly in high frequency operations. As a result, IC packages commonly employ a leadframe that has a number of electrically conductive contacts, a die attach pad and a conductive ring or rings, conductive lines or an array of conductive dots formed generally around the circumference of the die attach pad and between the die attach pad and the contacts. Typically, the ring(s), lines or dots of the array are used as power and/or ground planes and are formed of silver stripes or dots on the bare copper leadframe. A semiconductor die is mounted on the die attach pad and electrically conductive bond wires are used for electrical connections between bond pads on the semiconductor die and the leads, the die attach pad and the ring(s) or dots of the array. The silver on the copper leadframe is detectable by an automated vision system for a robotic wire bonding apparatus. Thus, the silver dot, stripe or ring on the copper leadframe are identified for wire bonding to an accurate and repeatable position.

Unfortunately, the copper leadframe is subjected to thermal processes such as die attach curing and wire bond heating that cause the copper to oxidize from a brown copper color to blue, or in some cases to a silver color. This often occurs when a problem is encountered during the wire bond process. For example, if operator assistance is required, the leadframe strip often sits on a high temperature heater block until the operator arrives, by which time the copper has turned silver in color This is particularly problematic as the vision system of the wire bonding apparatus uses the silver rings, lines or dots on the copper background in order to accurately and repeatably wire bond. The vision system, however, may not be able to differentiate between the silver rings, lines or dots and the oxidized copper background. Thus, the wire bonding apparatus fails to bond or bonds in the wrong location.

Accordingly, it is an object of an aspect of the present invention to provide a leadframe having characteristics for improved downbond registration during automatic wire bonding.

SUMMARY OF THE INVENTION

According to an aspect of the present invention, there is provided a process for enhancing visual detectability of a copper leadframe having a die attach pad and a plurality of contacts, during automated wirebonding in the production of an integrated circuit package. The process includes selectively plating silver on the die attach pad of the leadframe and around a periphery of the die attach pad and surface treating the leadframe to cause a color change an a surface of the leadframe for improved visual detectability of the selectively plated silver.

According to another aspect of the present invention, there is provided a leadframe having a die attach pad for mounting a semiconductor die thereon, a plurality of conductive leads circumscribing the die attach pad, silver plating disposed on a portion of the die attach pad, around a periphery thereof and a layer of organo-metallic complexes on at least a portion of the die attach pad and the contact pads According to another aspect of the present invention there is provided an integrated circuit package. The integrated circuit package includes a die attach pad, a semiconductor die mounted to a portion of the die attach pad, at least one row of conductive leads circumscribing the die attach pad, silver plating disposed on a portion of the die attach pad, around a periphery of the die attach pad and outside a perimeter of the semiconductor die, and a layer of organo-metallic complexes on at least a portion of the die attach pad and the contact pads.

According to yet another aspect of the present invention, there is provided the use of a mixture of at least one triazole compound with a polymeric stabilizer to cause a color change on a surface of a copper leadframe for improved visual detectability of selectively plated silver.

According to still another aspect of the present invention, there is provided the use of a mixture of hydrogen peroxide and benzotriazole to cause a color change on a surface of a copper leadframe for improved visual detectability of selectively plated silver.

Advantageously the chemical dipping of the copper leadframe ensures that there is a visually discernable difference between the copper and selectively plated silver. Thus, the silver can be easily identified by a visual detection system for automated downbonding (wirebonding). In one embodiment of the present invention, the chemical dipping does not degrade the wire bondability performance of the silver plated surfaces. In one embodiment of the present invention, the chemical dipping improves adhesion of the mold compound to the copper surface.

BRIEF DESCRIPTION OF THE DRAWINGS

The present invention will be better understood with reference to the following drawings wherein like numerals refer to like parts throughout, and in which:

FIG. 2A is a top view of an integrated circuit package manufactured in accordance with an embodiment of the present invention; and FIG. 2B is a top view of an integrated circuit package manufactured in accordance with another embodiment of the present invention.

DETAILED DESCRIPTION OF THE PREFERRED EMBODIMENTS

Reference is first made to FIGS. 1A to 1G to describe a process for enhancing visual detectability of a leadframe according to a first embodiment of the present invention.

The process described herein is not limited to processing of leadless plastic chip carrier (LPCC) integrated circuits and can be used in, for example, the processing of plastic leaded chip carrier (PLCC), small outline integrated circuit (SOIC), quad flat pack (QFP) and thin quad flat pack (TQFP) packages.

The first described embodiment relates to a process for enhancing visual detectability of a leadframe for an LPCC, an improvement over the process set forth in U.S. Pat. No. 6,229,200, the contents of which are incorporated herein by reference.

Figure 1A:
FIGS. 1A to 1G show processing steps for manufacturing an integrated circuit package according to one embodiment of the present invention.
Figure 1B:
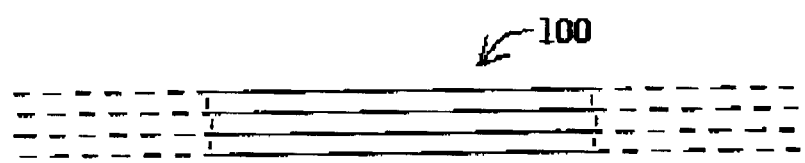
Figure 1C:
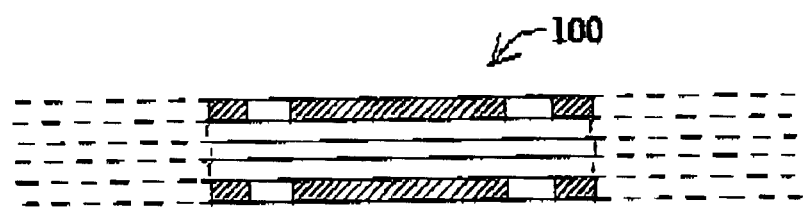

Referring to FIG. 1A, an elevation view is provided of a copper panel substrate which forms the raw material of the leadframe strip 100. As discussed in greater detail in U.S. Pat. No 6,229,200, the leadframe strip is divided into a plurality of sections, each of which incorporates a plurality of leadframe units in an array (for example, a 3×3 array, 5×5 array, etc.). Only one such unit is depicted in the elevation view of FIG. 1A, portions of adjacent units being shown by stippled lines.

Figure 1D:
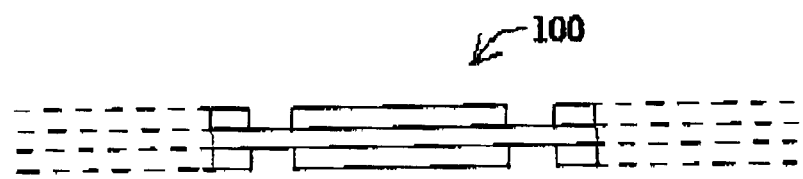
Figure 1E:
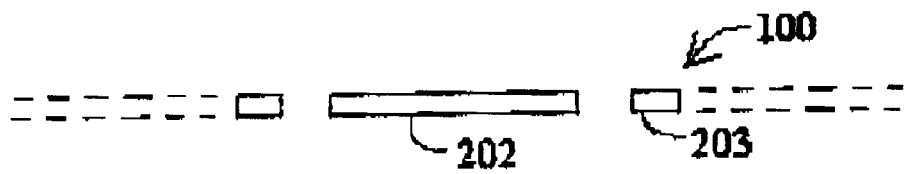

The leadframe strip 100 is covered with an etch resist mask 102 (FIG. 1B) in order to mask predetermined areas from etching and the etch resist mask is selectively exposed (FIG. 1C) and developed (FIG. 1D). The leadframe strip 100 is then subjected to an etching process to create the contacts, in the form of contact pads 203, and die attach pad 202 (FIG. 1E).

Figure 1F:
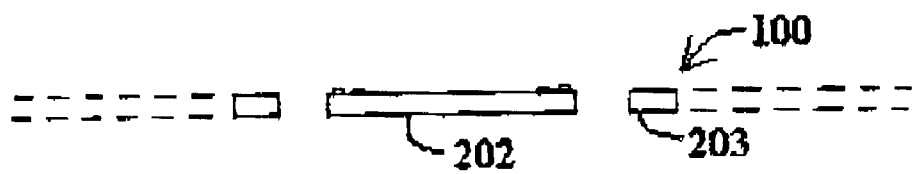

The leadframe is then mechanically or chemically masked, as would be understood by those of skill in the art and plated with silver. Thus, the silver is selectively plated as shown in FIG. 1F. The selectively applied silver plating is applied in an array of dots or a ring around the periphery of the die attach pad 202, as best shown in FIGS. 2A and 2B. The silver provides improved wire bonding and is visually discernable from the copper leadframe.

Next the leadframe is dipped into a chemical which reacts with the bare copper to effectively change the color of the copper. In the preferred embodiment, triazole compounds with a polymeric stabilizer are used to form a thin layer of organo-metallic complexes or intermletallics that are dark in color, on the copper leadframe. One example of a suitable chemical is a mixture of hydrogen peroxide and benzotriazole, preferably in the range of about 30% to about 40% by weight hydrogen peroxide, from about 1% to about 5% by weight benzotriazole and the remainder being water. The leadframe is dipped into the chemical for a period of time suitable for changing the color of the copper. In one embodiment, the leadframe is dipped into the chemical mixture, which is held at a temperature of from about 30° C. to about 40° C., and preferably at about 35° C., for about 10 seconds to about 50 seconds, and preferably for about 30 seconds. The chemical treatment does not adversely affect wirebondability performance or significantly discolor the silver plating A singulated semiconductor die 206 is conventionally mounted via epoxy, or other means, to the die attach pad 202, and the epoxy is cured. Gold wires 205 are then bonded between the semiconductor die 206 and peripheral leads or contacts 203 and between the semiconductor die and the die attach pad. More specifically, the gold wires are bonded to the silver plated regions. The silver plated regions are discernable from the chemically treated (dipped) copper leadframe and are therefore detectable by a vision detection system during automated wire bonding This discoloration of the copper is stable through various temperature excursions.

Figure 1G:
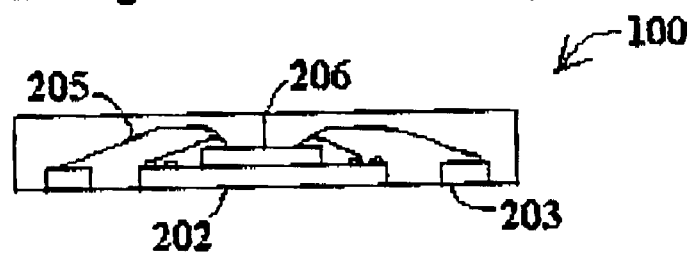

The leadframe is then molded and singulated or saw punched using known techniques. The resulting integrated circuit package is shown in FIG. 1G.

The present invention is not limited to LPCC integrated circuits and can be used in, for example, the PLCC, SOIC, QFP and TQFP circuits. In each of these embodiments, a leadframe is masked by mechanical or chemical masking, Chemical masking is preferable for the purpose of accuracy of masking. Next, silver is selectively plated on the leadframe in an array of dots or lines around the periphery of the die attach pad and the selectively silver plated. Then the leadframe is chemically dipped to cause the bare copper to discolor, thereby ensuring a discernable visual difference between the copper and the silver plating for visual detection.

The embodiments described herein can be varied or modified. For example, the contact pads can be plated With silver as well. Other modifications and variations will occur to those of skill in the art. All such modifications and variations are believed to be within the scope and sphere of the present invention, as set forth in the claims appended hereto.

What is claimed is:

1. A process for enhancing visual detectability of a copper leadframe having a die attach pad and a plurality of contacts, during automated wirebonding in the production of an integrated circuit package comprising:

selectively plating silver on said die attach pad of said leadframe and around a periphery of said die attach pad; and surface treating said leadframe to cause a color change on a surface of said leadframe to improve visual detectability of said selectively plated silver during automated wirebonding to said selectively plated silver.

2. The process according to claim 1 wherein said surface treating comprises chemical dipping of said leadframe.

3. The process according to claim 2 wherein said silver is selectively plated In at least one of a ring, a line and an array of dots on said die attach pad.

4. The process according to claim 2 wherein said chemical dipping comprises dipping in triazole compounds with a polymeric stabilizer to form a thin layer of organo-metallic complexes on the leadframe.

5. The process according to claim 3 wherein said chemical dipping comprises dipping in a mixture of hydrogen peroxide and benzotriazole.

6. The process according to claim 5 wherein said hydrogen peroxide is present in an amount of from about 30% to about 40% and said benzotriazole is present in an amount of from about 1% to about 5%.

7. A process for enhancing visual detectability of a copper leadframe comprising:

applying a mixture of at least one triazole compound with a polymeric stabilizer to cause a color change on a surface of the copper leadframe for improved visual detectability of at least one of a ring, a line and an array of silver dots.

8. A process for enhancing visual detectability of a copper leadframe comprising:

applying a mixture of hydrogen peroxide and benzotriazole to cause a color change on a surface of the copper leadframe for improved visual detectability of at least one of a silver ring, a line and an array of silver dots.

9. The process for enhancing visual detectability of a copper leadframe according to claim 8 wherein said hydrogen peroxide is present in an amount of from about 30% to about 40% and said benzotriazole is present in an amount of from about 1% to about 5%.

* * * * *